United States Patent
Shi et al.

(10) Patent No.: US 11,043,484 B1
(45) Date of Patent: Jun. 22, 2021

(54) METHOD AND APPARATUS OF PACKAGE ENABLED ESD PROTECTION

(71) Applicant: Xilinx, Inc., San Jose, CA (US)

(72) Inventors: Hong Shi, Fremont, CA (US); James Karp, Saratoga, CA (US); Siow Chek Tan, Los Gatos, CA (US); Martin L. Voogel, Niwot, CO (US); Mohsen H. Mardi, Saratoga, CA (US); Suresh Ramalingam, Fremont, CA (US); David M. Mahoney, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 75 days.

(21) Appl. No.: 16/362,134

(22) Filed: Mar. 22, 2019

(51) Int. Cl.
  *H01L 27/02* (2006.01)
  *G01R 1/04* (2006.01)
  *H01L 25/065* (2006.01)
  *H01L 23/498* (2006.01)

(52) U.S. Cl.
  CPC ........ *H01L 27/0248* (2013.01); *G01R 1/0483* (2013.01); *H01L 23/49816* (2013.01); *H01L 25/0657* (2013.01)

(58) Field of Classification Search
  CPC .......................... H01L 27/0248; G01R 1/0483
  See application file for complete search history.

(56) References Cited

U.S. PATENT DOCUMENTS

| 5,640,303 | A  | * | 6/1997 | Hooley | H05K 7/1061 |
| | | | | | 165/46 |
| 6,046,597 | A  | * | 4/2000 | Barabi | G01R 1/0483 |
| | | | | | 257/E23.078 |
| 6,844,749 | B2 | | 1/2005 | Sinclair | |
| 7,902,668 | B2 | * | 3/2011 | Sato | H01L 24/17 |
| | | | | | 257/738 |
| 9,252,593 | B2 | * | 2/2016 | Wang | H05F 3/02 |
| 9,408,284 | B2 | * | 8/2016 | Kow | H01L 23/60 |
| 10,177,107 | B2 | | 1/2019 | Camarota | |

(Continued)

OTHER PUBLICATIONS

Specification and drawings for U.S. Appl. No. 15/802,251, filed Nov. 2, 2017, Mardi et al.

(Continued)

*Primary Examiner* — Reena Aurora
(74) *Attorney, Agent, or Firm* — Patterson + Sheridan, LLP

(57) ABSTRACT

Techniques for electrostatic discharge (ESD) protection in integrated circuit (IC) chip packages methods for testing the same are described that are configured to directs the risk of ESD events through ground and power interconnects preferentially over I/O interconnects to enhance ESD protection in chip packages. In one example, a chip package is provided that includes an IC die, a substrate, and a plurality of interconnects. The plurality of interconnects are exposed on a side of the substrate opposite the IC die. The interconnects provide terminations for substrate circuitry formed within the substrate. At least one of the last 5 interconnects of the plurality of interconnects respectively comprising rows and columns of interconnects disposed along the edges of the substrate that closest to each corner of substrate project farther from the substrate than interconnects within those rows and columns that are configured as I/O interconnects.

20 Claims, 11 Drawing Sheets

(56) References Cited

U.S. PATENT DOCUMENTS 10,539,610 B2 * 1/2020 Mardi ................ G01R 31/2853
10,564,212 B2 * 2/2020 Mardi ................ G01R 1/0466

OTHER PUBLICATIONS

Karp, James et al., "FinFET MPSoC 32 GB/s Transceivers: Custom ESD Protection and Verification," Proc. of the 2016 IEEE 59th International Midwest Symposium on Circuits and Systems, Oct. 16, 2016, pp. 1-4, IEEE, Piscataway, New Jersey, USA.

Karp, James et al., "Meet Automotive ESD and SEED Requirements with Zynq UltraScale+ MPSoCs," WP500 (v1.0), Feb. 13, 2018, pp. 1-12, Xilinx, Inc., San Jose, California, USA.

* cited by examiner

METHOD AND APPARATUS OF PACKAGE ENABLED ESD PROTECTION

TECHNICAL FIELD

Examples of the present disclosure generally relate to semiconductor devices and testing devices for the same, and in particular, to electrostatic discharge (ESD) protection for chip packages.

BACKGROUND

Electronic devices, such as tablets, computers, copiers, digital cameras, smart phones, control systems and automated teller machines, among others, often employ electronic components that leverage chip package assemblies for increased functionality and higher component density. Conventional chip packaging schemes often utilize a package substrate, often in conjunction with a through-silicon-via (TSV) interposer substrate, to enable one or more integrated circuit (IC) dies to be mounted to a single package substrate. The IC dies may include memory, logic or other IC devices.

To prevent damage to the dies and chip package, circuitry for electrostatic discharge (ESD) protection have been incorporated into most conventional dies. In most conventional applications, the ESD circuitry includes routing that provides a low resistive path from solder balls on the package substrate down to active circuitry of the I/O die. Conventional ESD routing may include dual diodes and power clamps. However, ESD continues to be problematic.

SUMMARY

Techniques for electrostatic discharge (ESD) protection in integrated circuit (IC) chip packages methods for testing the same are described that are configured to directs the risk of ESD events through ground and power interconnects preferentially over I/O interconnects to enhance ESD protection in chip packages. In one example, a chip package is provided that includes an IC die, a substrate, and a plurality of interconnects. The plurality of interconnects are exposed on a side of the substrate opposite the IC die. The interconnects provide terminations for substrate circuitry formed within the substrate. At least one of the last 5 interconnects of the plurality of interconnects respectively comprising rows and columns of interconnects disposed along the edges of the substrate that are closest to each corner of substrate project farther from the substrate than interconnects within those rows and columns that are configured as I/O interconnects In another example, an integrated circuit (IC) package is provided that includes an IC die, a substrate, and a plurality of interconnects. The IC die has a die body and die circuitry formed within the die body. The substrate has a first side, a second side and substrate circuitry. The die body is mounted to the first side of the substrate such that the substrate circuitry is electrically coupled to the die circuitry. The plurality of interconnects are exposed on the second side of the substrate. The plurality of interconnects provide terminations for the substrate circuitry formed within the substrate. The plurality of interconnects include a first row of interconnects disposed along a first edge of the first side, a second row of interconnects disposed along a second edge of the first side, a first column of interconnects disposed along a third edge of the first side, and a second column of interconnects disposed along a fourth edge of the first side. The first and second rows and the first and second columns meet at four corners of the first side, wherein at least one of the last 5 interconnects of the plurality of interconnects that is closest to the corner of each of the first and second rows and columns has a first height that is greater than a second height of another interconnect contained in the same row or column of interconnects.

In another example, an integrated circuit (IC) package is provided that includes an IC die coupled to a first surface of a substrate by first interconnects, and a plurality of second interconnect coupled to a second surface of the substrate. The IC die has a die body and die circuitry formed within the die body. The die body is mounted to the first side of the substrate such that substrate circuitry is electrically coupled to the die circuitry by the first interconnects. The plurality of first interconnects are configured as ground, power and I/O interconnects. The plurality of second interconnects are exposed on the second side of the substrate. The plurality of second interconnects provide terminations for the substrate circuitry formed within the substrate. The plurality of second interconnects include a first row of second interconnects disposed along a first edge of the first side. The first row of second interconnects include two second interconnects disposed at opposite ends of the first row that are coupled to ground interconnects. The two second interconnects have a first height that is greater than a second height of the second interconnects of the first row that are coupled to I/O interconnects.

In another example, a test system is provided. The test system includes a base having a die receiving pocket, and a socket disposed in the die receiving pocket. The socket has a first surface configured to receive a device under test (DUT). The socket includes a first displaceable contact pin projecting a first distance beyond the first surface of the socket and a second displaceable contact pin projecting a second distance beyond the first surface of the socket. The second distance is less than the first distance. The first displaceable contact pin is coupled to ground and the second displaceable contact pin is configured to provide an I/O signal to the DUT.

In still another example, a method for testing a device under test (DUT), such as chip package is provided. The method includes placing a DUT in an a test system, and contacting the DUT with a ground pin prior to contacting the DUT with a signal pin.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
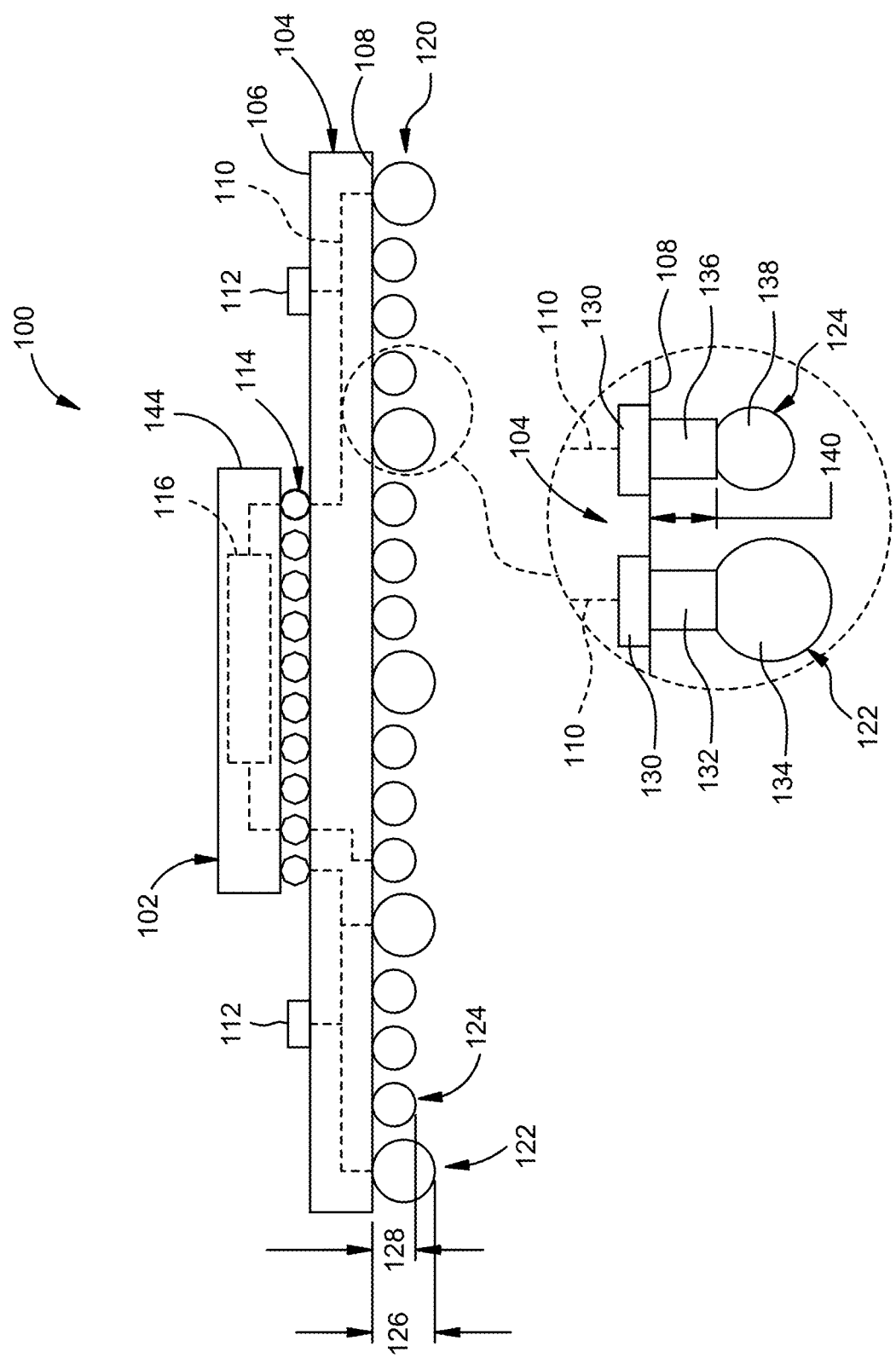
FIG. 1 is a schematic side view of an integrated circuit (IC) chip package, according to an example implementation, including an enlargement depicting two interconnects in more detail.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for electrostatic discharge (ESD) protection in an integrated circuit (IC) chip package are described. The techniques include a chip package that directs the risk of ESD events through ground and power interconnects preferentially over I/O interconnects to enhance ESD protection in IC packages. Since ESD protection circuitry formed within an IC die of the chip package that is connected the ground and power interconnects is more robust than circuitry connected to I/O interconnects, ESD protection is significantly enhanced. Thus, because I/O interconnects are either completely screened from or the probability of their coupling to electrostatically charged elements of machinery or humans is significantly reduced, the risk of ESD exposure of charge-sensitive circuitry coupled to the I/O interconnects is significantly reduced, consequently making for a more ESD-robust IC package.

In other examples, automated test equipment (ATE) is utilized to enhance ESD protection of chip packages. The ATE is configured to directs the risk of ESD events preferentially to ground or power contacts pins over I/O interconnects to mitigate potential damage to the device under test (DUT), such as a chip package, from ESD events. In one example, the ATE includes a first contact pin that is configured to first contact the DUT preferentially first over other contact pins that are configured to contact the I/O interconnects of the DUT. The first contact pin is configured to contact a ground contact of the DUT. Since the first contact between the DUT and ATE is made between a ground or power contact of the DUT, ESD between the DUT and ATE preferentially routed through to ground or power contact pins of the DUT. Since the DUT is immediately grounded upon first contact with the ATE due to all the ATE pins being grounded upon DUT insertion, the risk of ESD damage to the DUT significantly reduced, making for higher production IC package yields and associated cost advantages.

Turning now to FIG. 1, FIG. 1 is a cross-section view of an integrated circuit (IC) device illustrated as IC chip package 100, according to an example implementation. The IC chip package 100 includes at least one IC die 102 stacked on a package substrate 104. The package substrate 104 can be any type organic substrate, inorganic substrate, or the like. Although the example of FIG. 1 illustrates a single IC die 102 mounted on a first (top) surface 106 of the package substrate 104, one or more additional IC dies may be included in the chip package 100. For example, one or more additional IC dies may be stacked on a top surface of the IC die 102, or one or more additional IC dies may be stacked on the first surface 106 of the package substrate 104 laterally adjacent to the IC die 102. Additionally, although the IC die 102 is shown in FIG. 1 as mounted on directly on the top surface 106 of the package substrate 104, an interposer substrate may be disposed between the IC die 102 and the package substrate 104 to facilitate electrical connects therebetween.

The IC die 102 may be a programmable logic device, such as field programmable gate arrays (FPGA), a memory device, an optical device, processor or other IC logic structure. Optical devices include photo-detectors, lasers, optical sources, and the like. In the embodiment depicted in FIG. 1, the IC die 102 is mounted to the top surface 106 of the package substrate 104 by a plurality of interconnects 114. The interconnects 114 electrically connect circuitry 116 formed in a die body 144 of the IC die 102 to the circuitry 110 of the substrate 104. The circuitry 116 of the IC die 102 generally includes ESD protection circuitry and charge-sensitive circuitry, as further described with reference to FIG. 4 below. In one example, the interconnects 114 include solder balls that electrically and mechanically couple the IC die 102 to the substrate 104. Some interconnects 114 are configured as I/O interconnects because they are connected to portions of the circuitry 116 that receive or send data signals. Other interconnects 114 are configured as power interconnects because they are connected to portions of the circuitry 116 that are configured to receive an input voltage or generate an output voltage. Still other interconnects 114 are configured as ground interconnects because they are connected to portions of the circuitry 116 that are configured be coupled to ground.

Continuing to refer to FIG. 1, in addition to the IC die 102, the top surface 106 of the package substrate 104 may also include surface mounted devices 112. The surface mounted devices 112 may be capacitors, inductors, resistors and the like. In the example depicted in FIG. 1, at least one of the surface mounted devices 112 is a decoupling capacitor. The surface mounted devices 112 are coupled to the circuitry 110 of the substrate 104. The circuitry 110 of the substrate 104 terminates at contact pads 130 formed on a second (bottom) surface 108 of the substrate 104.

A plurality of interconnects 120 are formed on the contact pads 130 and extend from the second surface 108 of the substrate 104. The plurality of interconnects 120 are utilized to mount the substrate 104 of the chip package 100 to a printed circuit board (PCB), not shown. The interconnects 120 include solder balls that electrically and mechanically couple circuitry 110 of the substrate 104 to circuitry of the PCB.

The plurality of interconnects 120 include a plurality of first interconnects 122 and a plurality of second interconnects 124. The second interconnects 124 are coupled to the I/O interconnects 114, while the first interconnects 122 are coupled to interconnects configured for one or both of ground and power. The first interconnect 122 generally extends farther from the second surface 108 of the package substrate 104 than the second interconnect 124. In FIG. 1, the first interconnect 122 extends a first distance 126 from the second surface 108 of the package substrate 104 while the second interconnect 124 extends a second distance 128 from the second surface 108 of the package substrate 104. A shown in FIG. 1, the first distance 126 is greater than the second distance 128. In one example, the first distance 126 is at least 10 percent greater than the second distance 128, for example, 10-15 percent greater. In one example, the first distance 126 is at least 0.44 mm greater than the second distance 128, for example, between 0.44 and 0.70 mm greater.

As discussed above, the interconnects 120 are formed on and electrically coupled to the contact pads 130. The interconnects 120 generally include a pillar formed on the contact pad 130 and a solder ball formed on the pillar. For example, the first interconnect 122 includes a pillar 132 formed on the contact pad 130 and a solder ball 134 formed on the pillar 132. The pillar 132 is generally fabricated from one or more layers of metal. For example, the pillar 132 may include one or more layers of plated copper, but may also include nickel or other conductive material. Similarly, the second interconnect 124 includes a pillar 136 formed on the contact pad 130 and a solder ball 138 formed on the pillar 136. The pillar 136 is constructed similar to the pillar 132, and in the example depicted in FIG. 1, the pillars 132, 136 both extend a same distance 140 from the second surface 108 of the package substrate 104.

To achieve the difference in distances 126, 128, the solder ball 134 extends further from the second surface 108 of the package substrate 104 than the solder ball 138. In the example depicted in FIG. 1, the solder ball 134 has a diameter greater than a diameter of the solder ball 138, which accounts for the differences in the distances 126, 128. For example, the diameter of the solder ball 134 may be 10 percent or more greater than the diameter of the solder ball 138, such as 10 to 15 percent greater.

It is contemplated that the difference in distances 126, 128 may be realized utilizing different configurations for the first and second interconnects 122, 124. Two non-limiting examples of which are provide below with reference to FIGS. 2 and 3.

Figure 2:
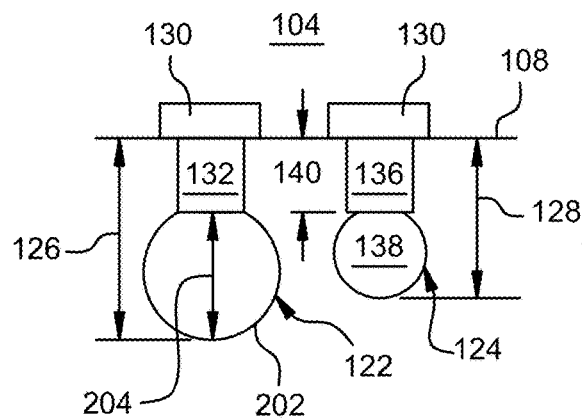
FIGS. 2-3 are partial schematic partial side view of alternative configurations of two interconnects that may be utilized in the chip package depicted in FIG. 1.

FIG. 2 is partial schematic partial side view of an alternative configuration of the interconnects 122, 124 that may be utilized in the IC package 100 depicted in FIG. 1. In the example of FIG. 2, the pillars 132, 136 both extend the same distance 140 from the second surface 108 of the package substrate 104, but a solder ball 202 comprising the first interconnect 122 has a dimension 204 that extends in a direction normal to the second surface 108 of the substrate 104 that is greater than the diameter of the solder ball 138 comprising the second interconnect 124. The dimension 204 is not a diameter as the shape of the solder ball 202 is not spherical, but oblong, such as an oval, pyramid or other similar shape. The dimension 204 may be 10 percent or more greater than the diameter of the solder ball 138, such as 10 to 15 percent greater. It is contemplated that the solder ball 138 may be oblong as well, and the diameter referenced above would then be the height of the solder ball 138 in a direction normal to the second surface 108 of the package substrate 104.

Figure 3:
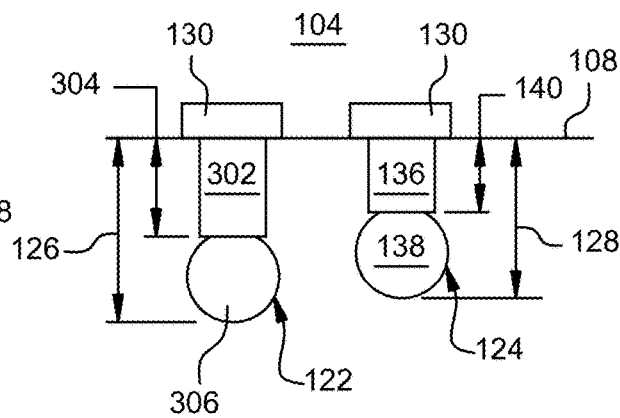

FIG. 3 is partial schematic partial side view of an alternative configuration of the interconnects 122, 124 that may be utilized in the IC package 100 depicted in FIG. 1. In the example of FIG. 3, a pillar 302 of the first interconnect 122 extends in a direction normal to the second surface 108 of the substrate 104 that is greater than the distance 140 of the pillar 136 of the second interconnect 124. For example, the pillar 302 may be 10 percent or more greater than the distance 140 of the pillar 136 of the second interconnect 124, such as 10 to 15 percent greater.

The difference in distances 126, 128 in the example of FIG. 3 may be also realized utilizing different configurations for solder balls 306, 138 of the first and second interconnects 122, 124. For example, the solder ball 306 of the first interconnect 122 may have a diameter or otherwise extend in a direction normal to the second surface 108 of the substrate 104 that is greater than a diameter of the solder ball 138. In one example, the solder ball 306 has a diameter or otherwise extends in a direction normal to the second surface 108 of the substrate 104 that is greater than the diameter of the solder ball 138, such that the combination of pillar height and solder ball dimension of the first interconnect 122 is at least 10 percent greater than the combination of pillar height and solder ball dimension of the second interconnect 124, such as about 10 to 15 percent greater.

Figure 4:
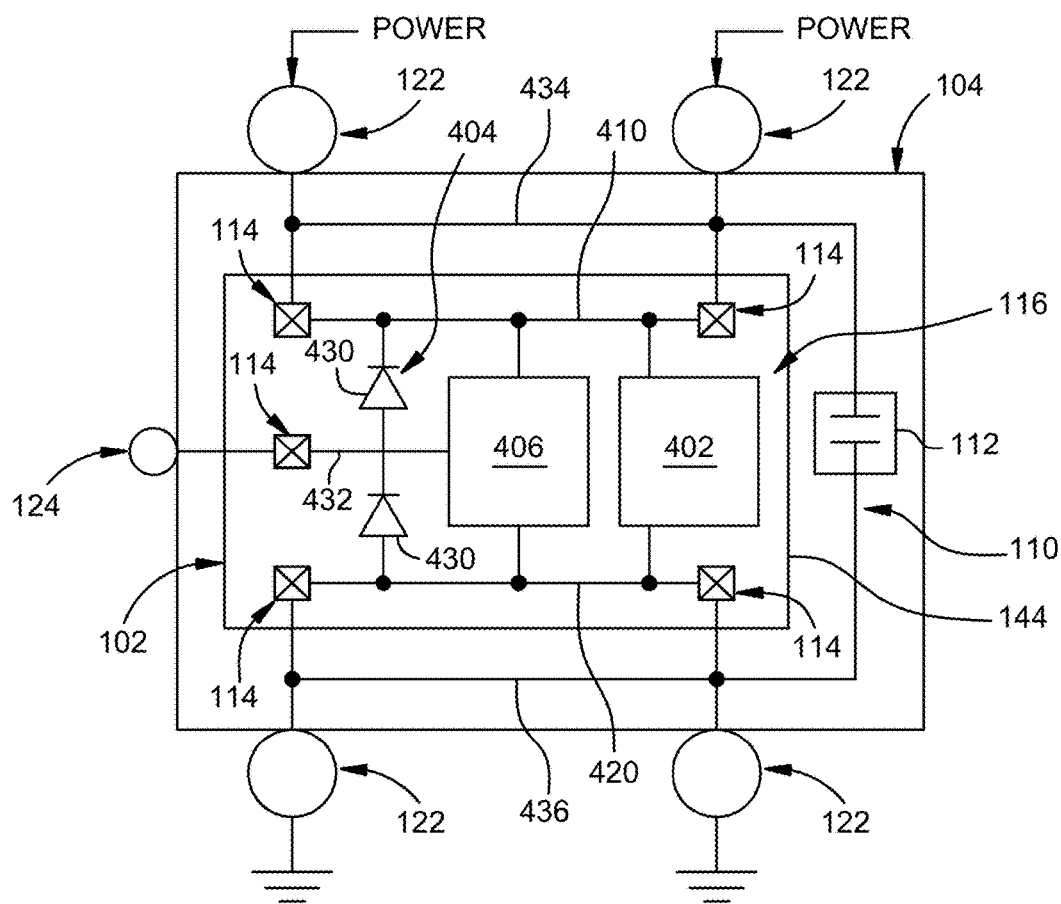
FIG. 4 is a schematic circuit diagram depicting circuitry of the chip package, according to an example.

Turning now to FIG. 4, FIG. 4 is a schematic circuit diagram depicting circuitry of the IC package. As discussed above, circuitry of the IC package includes die circuitry 116 and substrate circuitry 110. The die circuitry 116 is disposed in the die body 144 and includes first and second ESD protection circuitry 402, 404, and charge-sensitive circuitry 406. The die circuitry 116 terminates at the contact pads 130 (not shown in FIG. 4), which couple through interconnects 114 to the substrate circuitry 110 of the package substrate 104. The die circuitry 116 also includes routings 410, 420, 432. The routing 410 couples interconnects 114 to portions of the circuitry 402, 404, 406 that are configured to receive power, such as Vdd, Vcc and the like, from the first interconnects 122. The routing 420 couples interconnects 114 to portions of the circuitry 402, 404, 406 that are configured to be coupled to ground through the first interconnects 122. The routing 432 couples interconnects 114 to portions of the charge-sensitive circuitry 406 that are configured to transmit or receive I/O signals through the second interconnects.

The first ESD protection circuitry 402 generally includes an RC clamp. One terminal of the first ESD protection circuitry 402 is coupled through the routing 410 and interconnects 114 to the first interconnects 122 residing on the package substrate 104 that are configured the couple to power. A second terminal of the first ESD protection circuitry 402 is coupled through the routing 420 and interconnects 114 to the first interconnects 122 residing on the package substrate 104 that are configured to couple to ground. Thus, the RC clamp of the first ESD protection circuitry 402 is coupled between power and ground interconnects 122 of the package substrate 104.

Advantageously, by targeting either ground or power as a first contact with DUT, whether by protruding ground and/or power DUT contact pins, or designing ATE to contact ground and/or power package pins first, ESD protection is provided to the charge-sensitive circuitry 406.

The second ESD protection circuitry 404 generally includes first and second diodes 430. An input terminal of the first diode 430 of the second ESD protection circuitry 404 is coupled to the routing 410, and thus by the interconnects 114 to the first interconnects 122 residing on the package substrate 104 that are configured to be coupled to ground. The output terminal of the first diode 430 of the second ESD protection circuitry 404 is coupled to an input terminal of the second diode 430. The output terminal of the second diode 430 of the second ESD protection circuitry 404 is coupled to the routing 420, and thus by the interconnects 114 to the first interconnects 122 residing on the package substrate 104 that are configured to be coupled to power.

The second interconnect 124, which functions as in I/O interconnect, is coupled through the interconnect 114 and routing 432 to a node that is coupled to the output terminal of the first diode 430, the input terminal of the second diode 430, and the I/O portion of the charge-sensitive circuitry 406. In this manner, the second ESD protection circuitry 404 provides ESD protection to the I/O interconnects 124 coupled to the charge-sensitive circuitry 406. In general the larger ESD elements, diodes in this case, are, the better is their ESD protection. However, larger ESD elements have larger loading capacitance, which slows and reduces the bandwidth of the I/Os. From a performance point of view, it is advantageous for the size of ESD elements to be reduced, ideally to zero. This creates conflict in performance-ESD co-design. Another challenge is also related to performance. In order to meet performance specifications, I/O are often designed with the smallest transistors available at the given technology node. The small transistors are extremely vulnerable to ESD events because of their intrinsically weak electrostatic strength. In contrast, power to ground ESD discharge paths can be designed with very strong (large) ESD elements, as the discharge paths are not part of the signal path critical to performance. Advantageously, the ESD protection disclosed herein effectively redirects ESD from ESD-weak but performance critical I/O contact pins to ground and/or power contact pins of DUT which are comparatively strongly resistant to ESD.

The substrate circuitry 110 includes routings 434, 436. The routing 434 couples first interconnects 122 that are configured to be coupled to power to interconnects 114 connected to the power routing 410 of the die circuitry 116, and to one terminal of a decoupled capacitor comprising the surface mounted device 112. The routing 436 couples first interconnects 122 that are configured to be coupled to ground to interconnects 114 connected to ground routing 420 of the die circuitry 116, and to the other terminal of the decoupled capacitor comprising the surface mounted device 112. The decoupled capacitor of the surface mounted device 112 provide additional ESD protection between the first interconnects 122 that handle power and ground.

In an example of the operation, an ESD event may impart a charge on the one of the interconnects 122 coupled to power and thus cause current to flow through the routing 434 to the decoupled capacitor of the surface mounted device 112. RF components of the ESD event pass through the surface mounted device 112 to the routing 436 to ground via the interconnects 122. DC components of the ESD event pass through the routing 436 to the routing 410. From the routing 410, the DC components of the ESD event pass through the ESD protection circuits 402, 404 to ground via the routings 420, 436 and interconnects 144, 122.

Referring briefly back to FIG. 1, the location of the first interconnects 122 are selected such that contact is preferentially made with the first interconnects 122 instead of the second interconnects 124 due to the different between the distances 126, 128 of which the interconnects 122, 124 extend from the second surface 108 of the package substrate 104. Since the first interconnects 122, which are coupled to ground either directly, or indirectly through the surface mounted device 112 or ESD protection circuits 402, 404, extend further from the second surface 108 of the package substrate 104 keep are much more likely to be contacted and thus be an initiation point of an ESD event as compared to the second interconnects 124. Thus, first interconnects 122 directs the risk of ESD events through ground and power interconnects preferentially over the second interconnects 124 to enhance ESD protection in IC packages. Since ESD protection circuitry 402, 404 formed within the IC die 102 of the chip package 100 that is connected the ground and power interconnects is more robust than the portions of the charge-sensitive circuitry 406 connected to I/O interconnects 124, ESD protection of the chip package 100 is significantly enhanced.

To improve preferential contact during handling of the chip package 100 with the first interconnects 122 over the second interconnects 124, the location of first interconnects 122 along the second surface 108 of the package substrate 104 is selected to be in locations where contact with the chip package 100 is most likely to occur. For example, the first interconnects 122 are located in the rows and columns of the interconnects 120 closest the edges of the package substrate 104. In another example, at least one of the first interconnects 122 may be located at or near the ends of the rows and columns of the interconnects 120 closest to the corners of the package substrate 104. Optionally, one or more of the first interconnects 122 may additionally be located about half way along the rows and columns of the interconnects 120 closest the edge of the package substrate 104, and further optionally about at about a quarter of the distance from the corner along the rows and columns of the interconnects 120 closest the edges of the package substrate 104. In other examples, all signal balls (i.e., first interconnects 124) are slightly smaller than power supply balls (i.e., second interconnects 124); all power supply balls are slightly larger than signal balls; all signal balls on the rows and columns closest to the package edge are slightly smaller than power supply balls; or all power supply balls on the rows and columns closest to the package edge are slightly larger than signal balls, among others.

Figure 5:
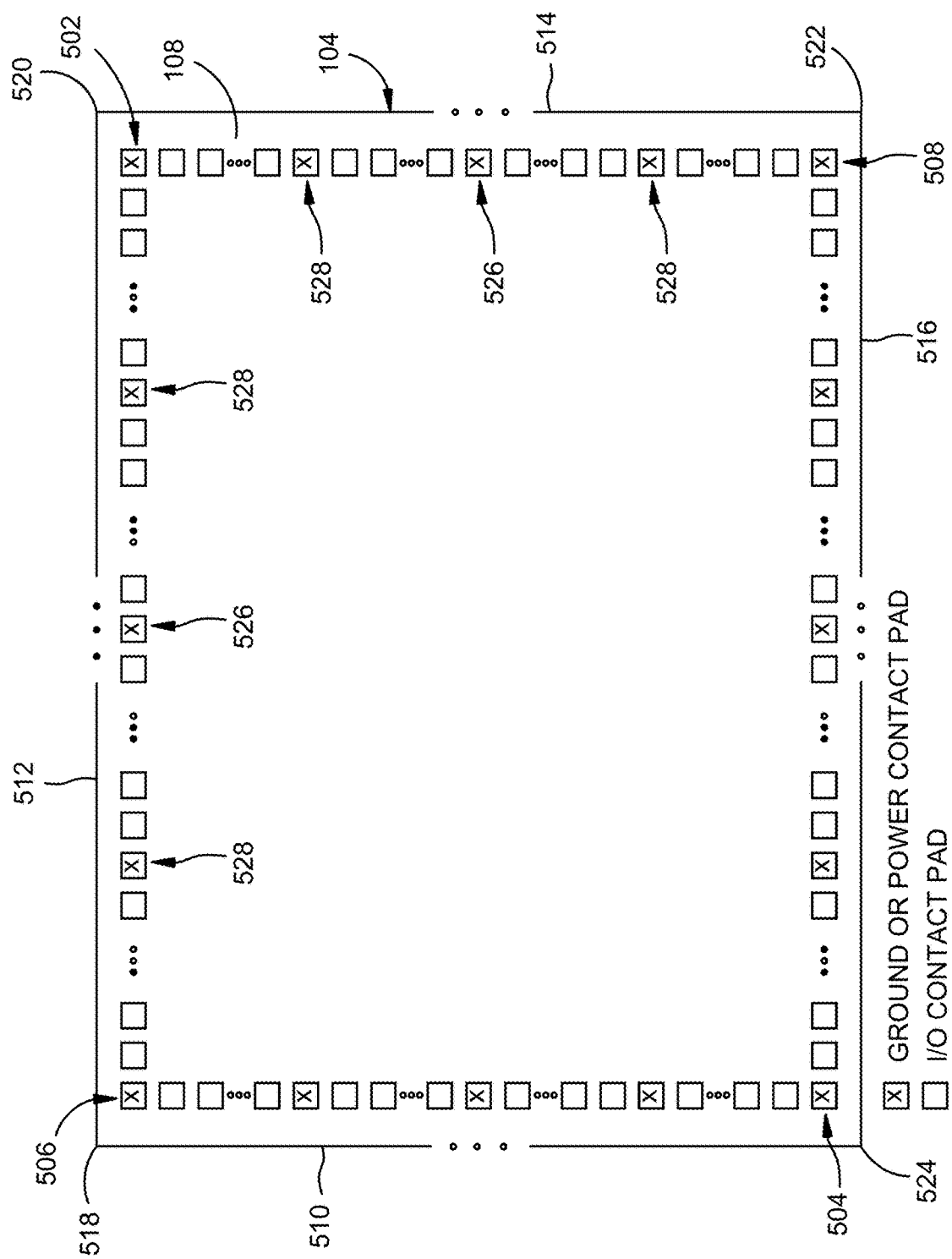
FIGS. 5-7 are exemplary alternative bottom views of a chip package, according to various examples.
Figure 6:
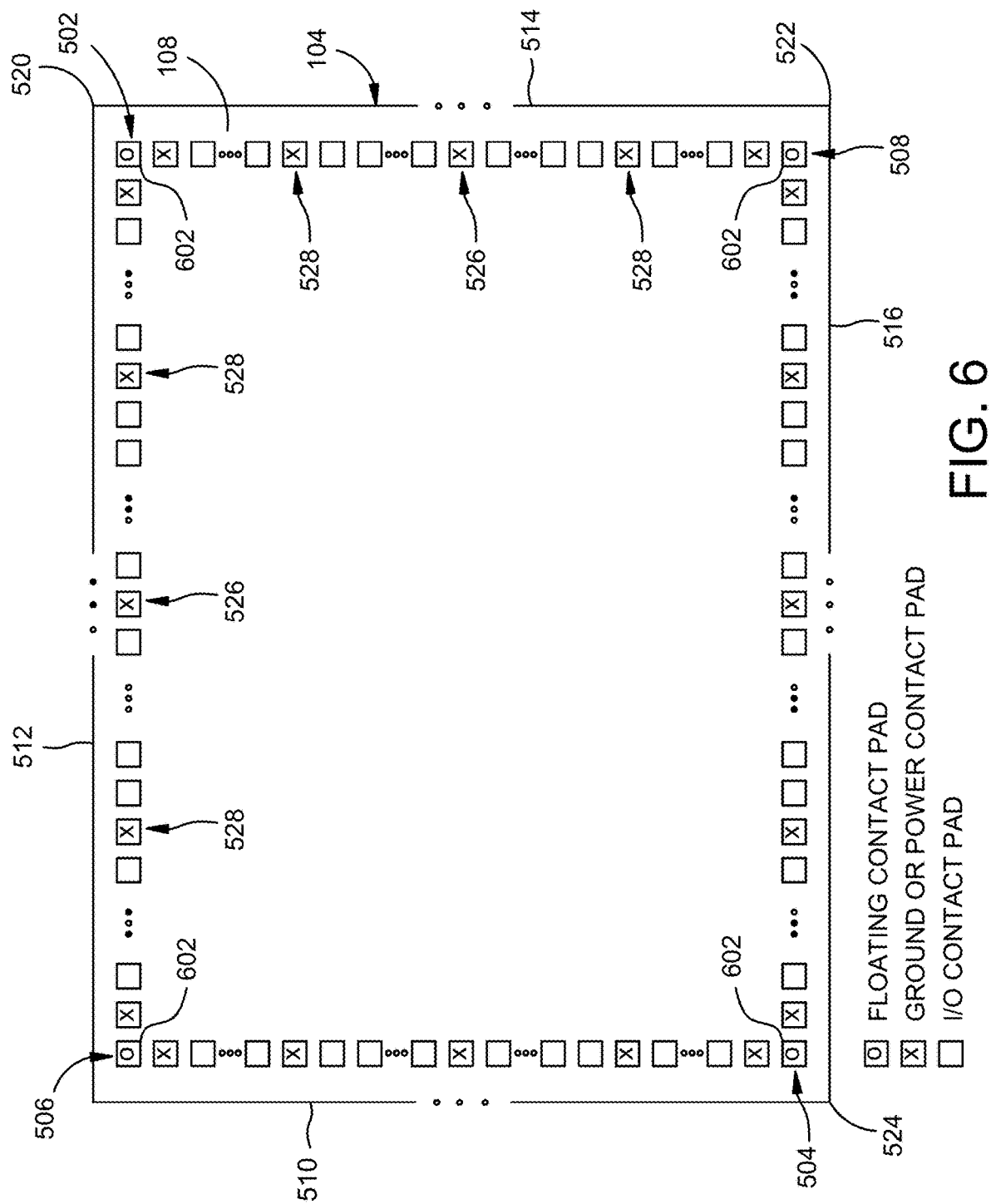
Figure 7:
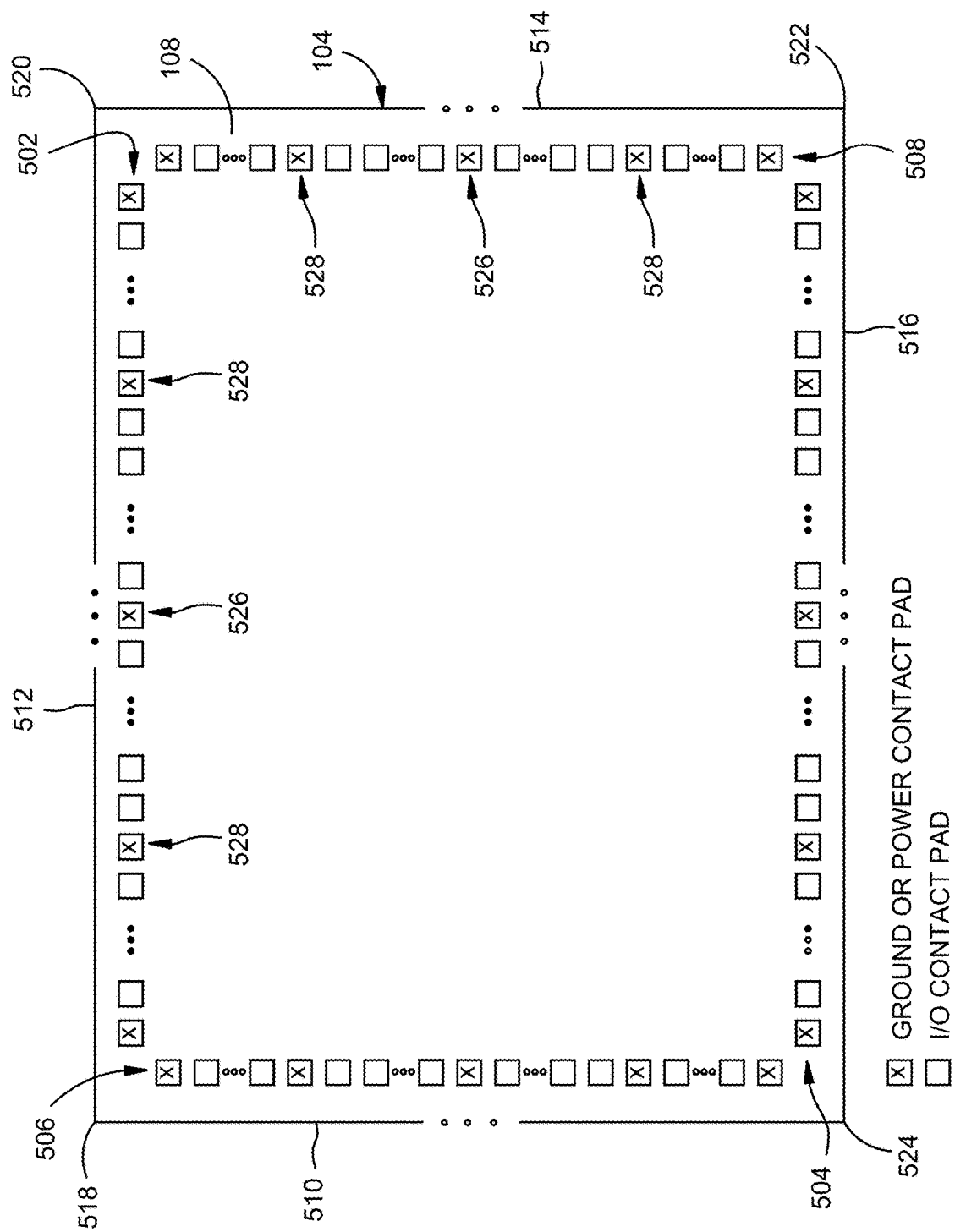

Further non-limiting examples of desirable locations of the first interconnects 122 relative the second interconnects 124 are provided through the description of FIGS. 5-7 that follow.

FIG. 5 is exemplary bottom view of the chip package 100, illustrating non-limiting example of desirable locations of the first interconnects 122 relative the second interconnects 124. In FIG. 5, only rows 502, 504 and columns 506, 508 of the interconnects 120 closest the edges 510, 512, 514, 516 of the package substrate 104 are illustrated. The edges 510, 512, 514, 516 of the package substrate 104 connect at respective corners 518, 520, 522, 524. Many additional interconnects 120 are present but are not shown between the rows 502, 504 and columns 506, 508 on the interior of the package substrate 104. Furthermore, the number of interconnects 120 comprising each of the rows 502, 504 and columns 506, 508 may vary, and the number of interconnects 120 shown in FIG. 5 is purely selected for clarity of illustration and to prevent clutter within the Figure. The interconnects 120 comprising the rows 502, 504 and columns 506, 508 disposed closest to the edges 510, 512, 514, 516 of the package substrate 104 include both first interconnects 122 configured for coupling to power or ground, and second interconnects 124 configured to transmit I/O signals. In FIG. 5, the first interconnects 122 are depicted by a box containing an X, while the second interconnects 124 are depicted by an empty box.

For example, the chip package 100 is most likely to be first touched at one or more of the corners 518, 520, 522, 524. Thus in one example, the first interconnects 122 in the rows 502, 504 and columns 506, 508 closest the edges 510, 512, 514, 516 are located near the corners 518, 520, 522, 524. For example, at least one of the five interconnects 120 of each rows 502, 504 and columns 506, 508 closest the corners 518, 520, 522, 524 is configured as a first interconnect 122. In the example illustrated in FIG. 5, the interconnect 120 of each rows 502, 504 and columns 506, 508 closest the corners 518, 520, 522, 524 is configured as a first interconnect 122. Additionally as illustrated in FIG. 5, the rows 502, 504 and columns 506, 508 may share the same first interconnect 122 disposed closest to the corners 518, 520, 522, 524.

Optionally, other interconnects 120 of the rows 502, 504 and columns 506, 508 may be configured as a first interconnect 122. For example, at least one of the interconnects 120 of the rows 502, 504 and columns 506, 508 that is disposed about half way between respective corners 518, 520, 522, 524 is configured as a first interconnect 122. In FIG. 5, this first interconnect 122 is shown as a midway interconnect 526. The midway interconnect 526, being located about half way between respective corners of the package substrate 104, may be within 5 interconnects 120 of an interconnect 120 located at the dimensional midpoint of the edge of the package substrate 104.

Optionally in addition to the midway interconnect 526, middle interconnects 528 configured as a first interconnect 122 may also be present in the rows 502, 504 and columns 506, 508 closest the edges 510, 512, 514, 516 of the package substrate 104. For example, each respective middle interconnect 528 may be located about half way between one of the midway interconnects 526 and a respective corner 518, 520, 522, 524 of the package substrate 104. The middle interconnect 528, located about half way between one of the midway interconnects 526 and a respective corner 518, 520, 522, 524 of the package substrate 104, may be within 5 interconnects 120 of an interconnect 120 located at half of the dimensional midpoint along the edge of the package substrate 104 measured from a corner of the package substrate 104.

FIG. 6 is another exemplary bottom view of the chip package 100 having a different configuration of desirable locations of the first interconnects 122 relative the second interconnects 124. The locations of the first interconnects 122 essentially the same as illustrated in FIG. 6, except that the last interconnect 120 in each row 502, 504 and column 506, 508 is not coupled to ground, power or configured to transmit an I/O signal. Rather, the last interconnect 120 in each row 502, 504 and column 506, 508, shown in FIG. 6 as a box containing a circle, is floating. The floating interconnect 120 shown in FIG. 6 by the box containing a circle is referred herein after as the floating interconnect 602.

Since the last interconnect 120 closest to the corners 518, 520, 522, 524 is floating, the first interconnect 122 closest the corners 518, 520, 522, 524 in each of the rows 502, 504 and columns 506, 508 is one of the next four interconnects 120 closest to the closest the corners. In the example illustrated in FIG. 6, the interconnect 120 of each rows 502, 504 and columns 506, 508 is disposed directly adjacent the floating interconnect 602.

Similar to the example described above with reference to FIG. 5, optional midway interconnects 526 and optional middle interconnects 528 may also be present in the rows 502, 504 and columns 506, 508 closest the edges 510, 512, 514, 516 of the package substrate 104.

FIG. 7 is another exemplary bottom view of the chip package 100 having a different configuration of desirable locations of the first interconnects 122 relative the second interconnects 124. The locations of the first interconnects 122 are essentially the same as illustrated in FIG. 5, except that the last interconnect 120 of each row 502, 504 is not shared with the adjacent column 506, 508, and the last interconnect 120 of each column 506, 508 is not shared with the adjacent row 502, 504. Thus, each of the interconnects 120 of each row 502, 504 and column 506, 508 closest to the corners 518, 520, 522, 524 that are configured as a first interconnect 122 that is uniquely present in only one of the rows 502, 504 and columns 506, 508. The first interconnect 122 closest to the corners 518, 520, 522, 524 is one of the last five interconnects 120 closest to the closest corner 518, 520, 522, 524. In the example depicted in FIG. 7, the first interconnect 122 closest to the corners 518, 520, 522, 524 is the interconnect 120 physically closest to the closest corner 518, 520, 522, 524.

Similar to the example described above with reference to FIG. 5, optional midway interconnects 526 and optional middle interconnects 528 may also be present in the rows 502, 504 and columns 506, 508 closest the edges 510, 512, 514, 516 of the package substrate 104.

Thus, the chip packages described above that directs the risk of ESD events through ground and power interconnects preferentially over I/O interconnects to enhance ESD protection in IC chip packages. Since much fewer ESD events occur though I/O interconnects, the risk of exposure ESD of charge-sensitive circuitry coupled to the I/O interconnects is significantly reduced, making for a more robust IC chip package.

As discussed above, test equipment may also be configured to direct the risk of ESD events through ground and power interconnects preferentially over I/O interconnects to enhance ESD protection in IC packages. Such test equipment may be utilized with chip packages such as the chip packages 100 described above, or with conventional chip packages FIG. 8 is a schematic side view of a chip package automated test equipment (ATE) 800 that is configured to preferentially ground a device under test (DUT), such as the chip packages 100 described above, and also conventional chip packages. The ATE 800 includes at least one test station 824, a workpress assembly 822, a base 808 and a test controller 816. The test station 824 and the workpress assembly 822 are coupled to the base 808.

Figure 8:
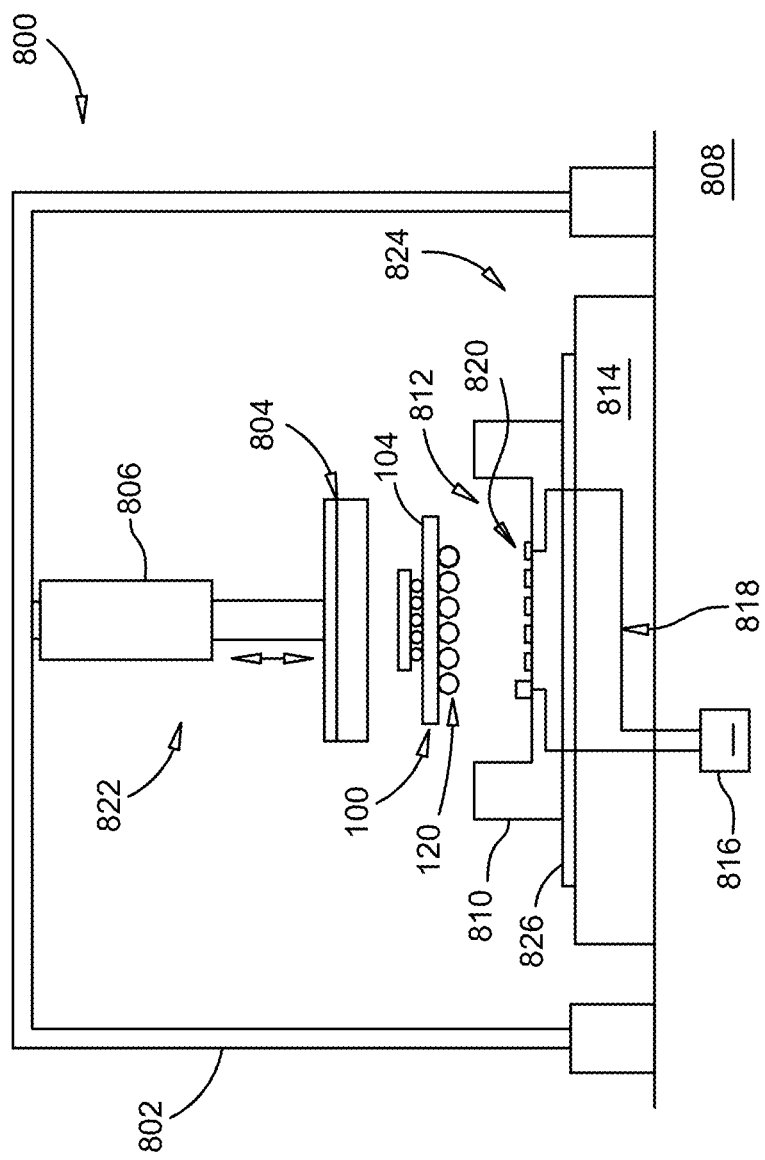
FIG. 8 is a schematic side view of an automated test equipment (ATE) that is configured to test a chip package, according to an example.

The test station 824 includes a mother board 814 that is mounted to the base 808. A daughter board 826 is coupled to the mother board 814. The daughter board 826 has one or more test sockets 810. Only a single test socket 810 is illustrated in FIG. 8 for simplicity. The test socket 810 generally includes a recess 812 configured to receive the chip package 100 to be tested by the ATE 800. The recess 812 includes exposed a plurality of displaceable contact pins 820 that are coupled by routing 818 running through the mother and daughter boards 814, 826 to the controller 816 to facilitate electric communication between the controller 816 and the chip package 100 during testing.

The workpress assembly 822 is supported by a support 802 above the test station 824. The support 802 is coupled to the base 808. The support 802 may be a stanchion, gentry, hinged arm or other suitable device that supports the workpress assembly 822 to be positive over the test station 824. The workpress assembly 822 is configured to urge (i.e., apply a force) and engage the chip package 100 with the socket 810 of test station 824 for testing as further described below.

The workpress assembly 822 includes a pusher 804 and an actuator 806. The pusher 804 has a bottom surface facing the socket 810. The pusher 804 is coupled to the actuator 806. The actuator 806 is operable to move the pusher 804 towards and away from the socket 810. In one example, the actuator 806 is coupled to the test controller 816 and automatically moves the pusher 804 in response to instructions from the test controller 816. The actuator 806 is configured to apply a force to the chip package 100 and push the chip package 100 against the socket 810 with sufficient force to ensure robust electrical contact between the interconnects 120 of chip package 100 and contact pins 820 formed in the recess 812 of the socket 810 to facilitate effective communication of power, ground and I/O (e.g., informational) signals that facilitate testing of the chip package 100. The actuator 806, such as a pneumatic cylinder, ball screw, or other linear actuator, controls the force exerted by the pusher 804 that pushes the chip package 100 against the socket 810. In one example, the actuator 806 is operable to urge the pusher 804 downward against the chip package 100 with a force of about 35 grams per solder ball 164. Alternatively, the workpress assembly 822 may be configured without a pusher 804 and an actuator 806, wherein the chip package 100 can be engaged with the socket 810 of test station 824 with zero force.

Figure 9:
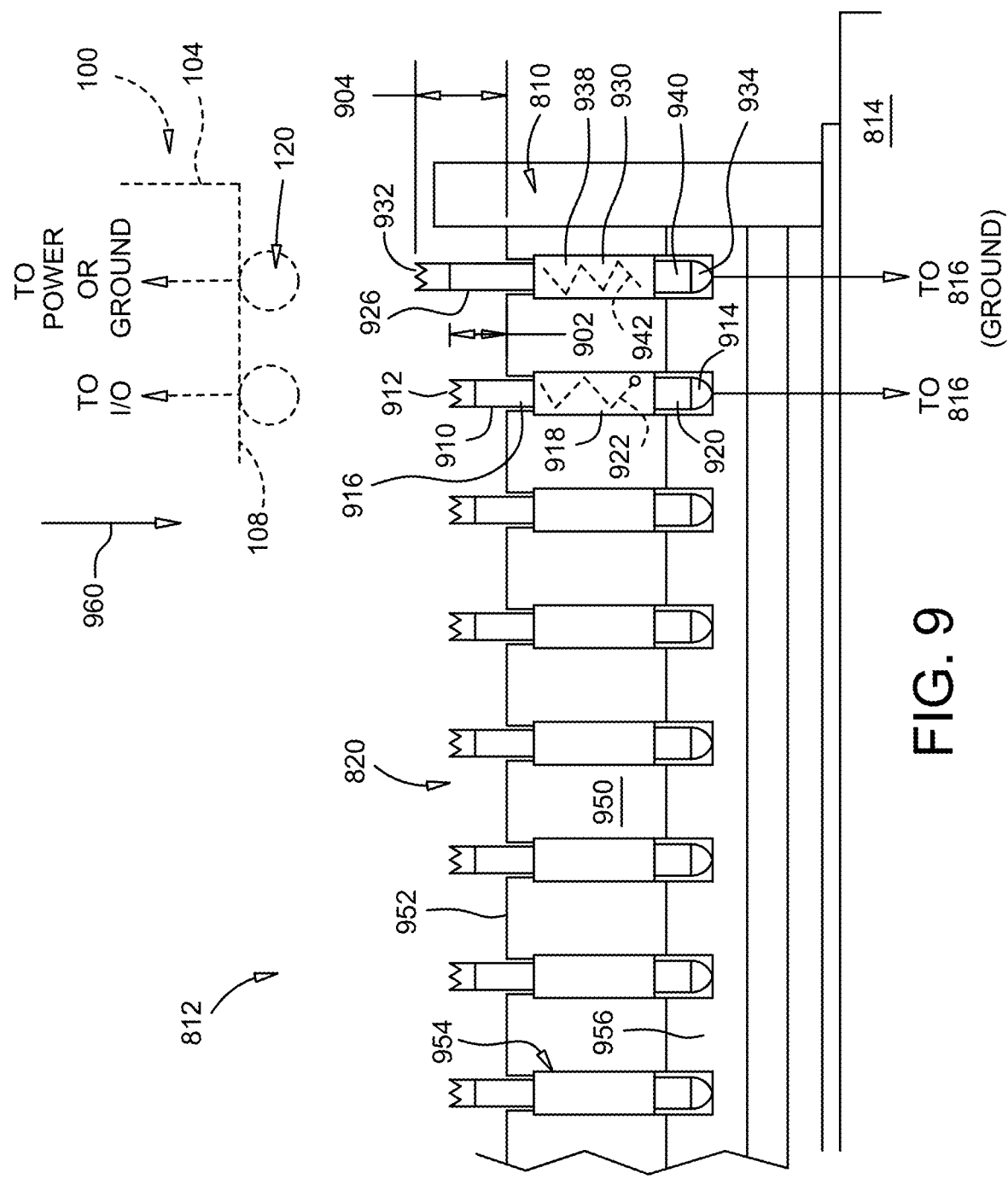
FIG. 9 is a partial schematic sectional view of the ATE of FIG. 8 illustrating a test block disposed in a test socket, according to an example.

FIG. 9 is a partial sectional view of the ATE 800 illustrating some of the displaceable contact pins 820 in greater detail. The contact pins 820, non-limiting examples of which include pogo pins and H-pins, generally include one or more first contact pins 930 that extend further from the socket 810 than a second contact pin 910. For example, the first contact pin 930 extends a distance 904 from a surface 952 of the the socket 810 that faces the pusher 804, while the second contact pins 910 extend a distance 902 from the surface 952 when the pins 910, 930 are fully extended. The distance 904 is greater than the distance 902. The first contact pin 930 is coupled to ground either directly or through the test controller 816, while the second contact pins 910 are configured to transmit I/O signals between the test controller 816 and the chip package 100. Some of the second contact pins 910 may also carry power. As the first contact pin 930 extend further from the socket 810 than the second contact pins 910, the chip package 100 is coupled to ground with the first contact between the chip package 100 and the socket 810, thus substantially preventing an ESD event occurring through second contact pins 910. In particular applications, the location of the first and second contact pins 910, 930 are selected in response to the location of the ground, power and I/O interconnects disposed on the bottom surface of the package substrate 104 of the chip package 100.

The first contact pins 930 generally includes a first portion 926 and a second portion 940 connected by a central portion 938. The first portion 926 is movable relative to the second portion 940. The first portion 926 includes an end 932 configured to contact interconnects 120 of the chip package 100. The second portion 940 includes an end 934 configured to connect to the routing 818 running through the mother and daughter boards 814, 826 to the controller 816. The first and second ends 932, 934 are conductively coupled so that current may be efficiently transmitted through the first contact pin 930.

The first contact pin 930 also includes a spring 942. The spring 942 allows the first portion 926 to be displaced relative to the second portion 940. For example, as interconnects 120 of the chip package 100 are pressed into the socket 810, the end 932 contacting the interconnects 120 moves towards the base 814 as pushed by the downward moving chip package 100. The force generated by the spring 942 is sufficient to provide good electrical connection between the interconnects interconnects 120 of the chip package 100 and the end 932 of the first contact pin 930 while not damaging the interconnect 120.

Similarly, the second contact pin 910 includes a first portion 916 and a second portion 920 connected by a central portion 918. The first portion 916 includes an end 912 configured to contact interconnects 120 of the chip package 100. The second portion 920 includes an end 914 configured to connect to the routing 818 running through the mother and daughter boards 814, 826 to the controller 816. The first and second ends 912, 914 are conductively coupled so that power, ground and signals may be efficiently transmitted through the second contact pin 910.

The second contact pin 910 also includes a spring 922. The spring 922 allows the first portion 916 to be displaced relative to the second portion 920, for example, as interconnects 120 of the chip package 100 are pressed into the socket 810 as described above. The force generated by the spring 922 is sufficient to provide good electrical connection between the interconnects interconnects 120 of the chip package 100 and the end 912 of the second contact pin 910 while not damaging the interconnect 120.

The socket 820 generally includes a base plate 950 and a cap plate 956. The cap plate 956 may be removably secured to the base plate 950, for example by fasteners. A stepped passage 954 for retaining the first and second contact pins 910, 930 extends through the base plate 950 and at least a portion cap plate 956. The stepped passage 954 exits the surface 952 of the base plate 950 facing the pusher 804, allowing the first portions 916, 926 of the first and second contact pins 910, 930 to extend out through the socket 810. A step within the stepped passage 954 is smaller than a diameter of the central portions 918, 938 of the contact pins 910, 930, thus permitting the contact pins 910, 930 to be captured within the stepped passage 954 upon installation of the cap plate 956 to the base plate 950. By unfastening the cap plate 956 from the base plate 950, the contact pins 910, 930 may be removed the stepped passage 954 for replacement or repair.

To improve preferential contact of the chip package 100 to ground, the locations of first contact pins 930 along the surface 952 of the socket 810 are selected to be in alignment with the ground and/or power interconnects 122 of chip package 100 are most likely. For example, the first contact pins 930 are located in the rows and columns of the contact pins 820 closest the edges of the recess 812 of the socket 810. In another example, at least one first contact pins 930 may be located at or near the ends of the rows and columns of the contact pins 820 closest to the corners of the recess 812 (that correspond to the corners of the package substrate 104). Optionally, one or more first contact pins 930 may additionally be located about half way along the rows and columns of the contact pins 820 closest the edges of the recess 812, and further optionally about at about a quarter of the distance from the corner along the rows and columns of the contact pins 820 closest the edges of the recess 812. Further non-limiting examples of desirable locations of the first contact pins 930 relative the second contact pins 910 are provided through the description of FIGS. 10-12 that follow.

Figure 10:
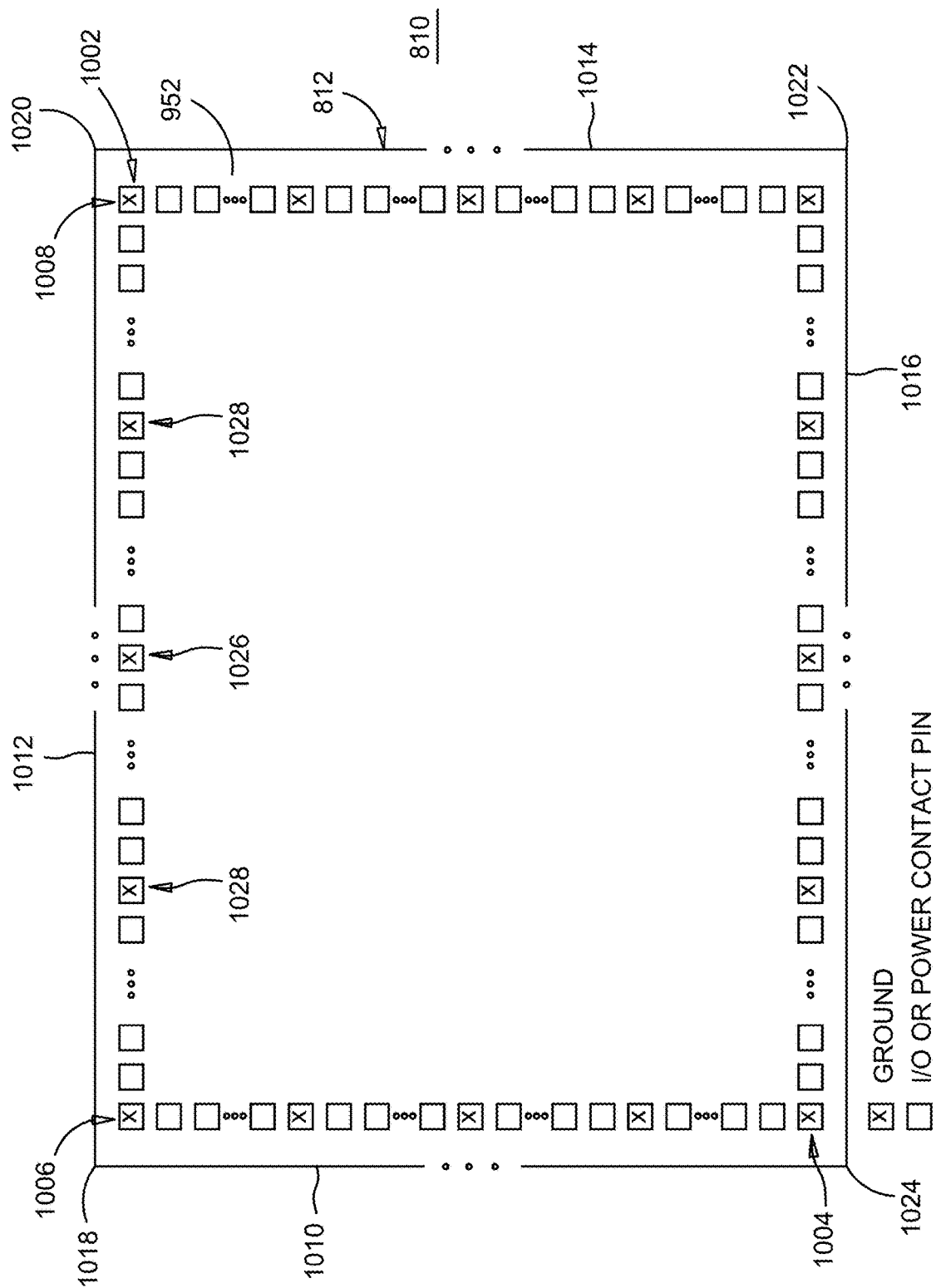
FIGS. 10-12 are exemplary alternative top views of the test block illustrating various configurations of contact pins, according to various examples.

FIG. 10 is exemplary top view of the surface 952 of the socket 810, illustrating non-limiting examples of desirable locations of the first contact pins 930 relative the second contact pins 910. In FIG. 10, only rows 1002, 1004 and columns 1006, 1008 of the contact pins 820 closest the edges 1010, 1012, 1014, 1016 of the recess 812 of the socket 810 are illustrated. The edges 1010, 1012, 1014, 1016 of the recess 812 of the socket 810 connect at respective corners 1018, 1020, 1022, 1024. Many additional contact pins 820 are present but are not shown between the rows 1002, 1004 and columns 1006, 1008 on the interior of the surface 952. Furthermore, the number of contact pins 820 comprising each of the rows 1002, 1004 and columns 1006, 1008 may vary, and the number of contact pins 820 shown in FIG. 10 is purely selected for clarity of illustration and to prevent clutter within the Figure. The contact pins 820 comprising the rows 1002, 1004 and columns 1006, 1008 disposed closest to the edges 1010, 1012, 1014, 1016 of the recess 812 of the socket 810 include both first contact pins 930 configured for coupling ground, and second contact pins 910 configured to transmit I/O signals or power to the die circuitry. In FIG. 10, the first contact pins 930 are depicted by a box containing an X, while the second contact pins 910 are depicted by an empty box.

For example, the chip package 100 is most likely configured to have a ground interconnect 114 at one or more of the corners of the substrate 104. Thus, in one example, the first contact pins 930 in the rows 1002, 1004 and columns 1006, 1008 closest the edges 1010, 1012, 1014, 1016 are located near the corners 1018, 1020, 1022, 1024 of the recess 812. For example, at least one of the five contact pins 820 of each rows 1002, 1004 and columns 1006, 1008 closest the corners 1018, 1020, 1022, 1024 is configured as a first contact pin 930. In the example illustrated in FIG. 10, the contact pin 820 of each rows 1002, 1004 and columns 1006, 1008 closest the corners 1018, 1020, 1022, 1024 is configured as a first contact pin 930. Additionally as illustrated in FIG. 10, the rows 1002, 1004 and columns 1006, 1008 may share the same first contact pin 930 disposed closest to the corners 1018, 1020, 1022, 1024.

Optionally, other contact pins 820 of the rows 1002, 1004 and columns 1006, 1008 may also be configured as a first contact pin 930. For example, at least one of the contact pins 820 of the rows 1002, 1004 and columns 1006, 1008 that is disposed about half way between respective corners 1018, 1020, 1022, 1024 of the recess 812 is configured as a first contact pin 930. In FIG. 10, this first contact pin 930 is shown as a midway contact pin 1026. The midway contact pin 1026, being located about half way between respective corners of the recess 812, may be within 5 contact pins 820 of a contact pin 820 located at the dimensional midpoint along the edge of the recess 812 of the socket 810.

Optionally in addition to the midway contact pin 1026, middle contact pins 1028 configured as a first contact pin 930 may also be present in the rows 1002, 1004 and columns 1006, 1008 closest the edges 1010, 1012, 1014, 1016 of recess 812 of the socket 810. For example, each respective middle contact pin 1028 may be located about half way between one of the midway contact pin 1026 and a respective corner 1018, 1020, 1022, 1024 of the recess 812. The middle contact pin 1028, located about half way between one of the midway contact pin 1026 and a respective corner 1018, 1020, 1022, 1024 of the recess 812 of the socket 810, may be within 5 contact pins 820 of a first contact pin 930 located at half of the dimensional midpoint along the edge of the recess 812 measured from a corner of the recess 812 of the socket 810.

Figure 11:
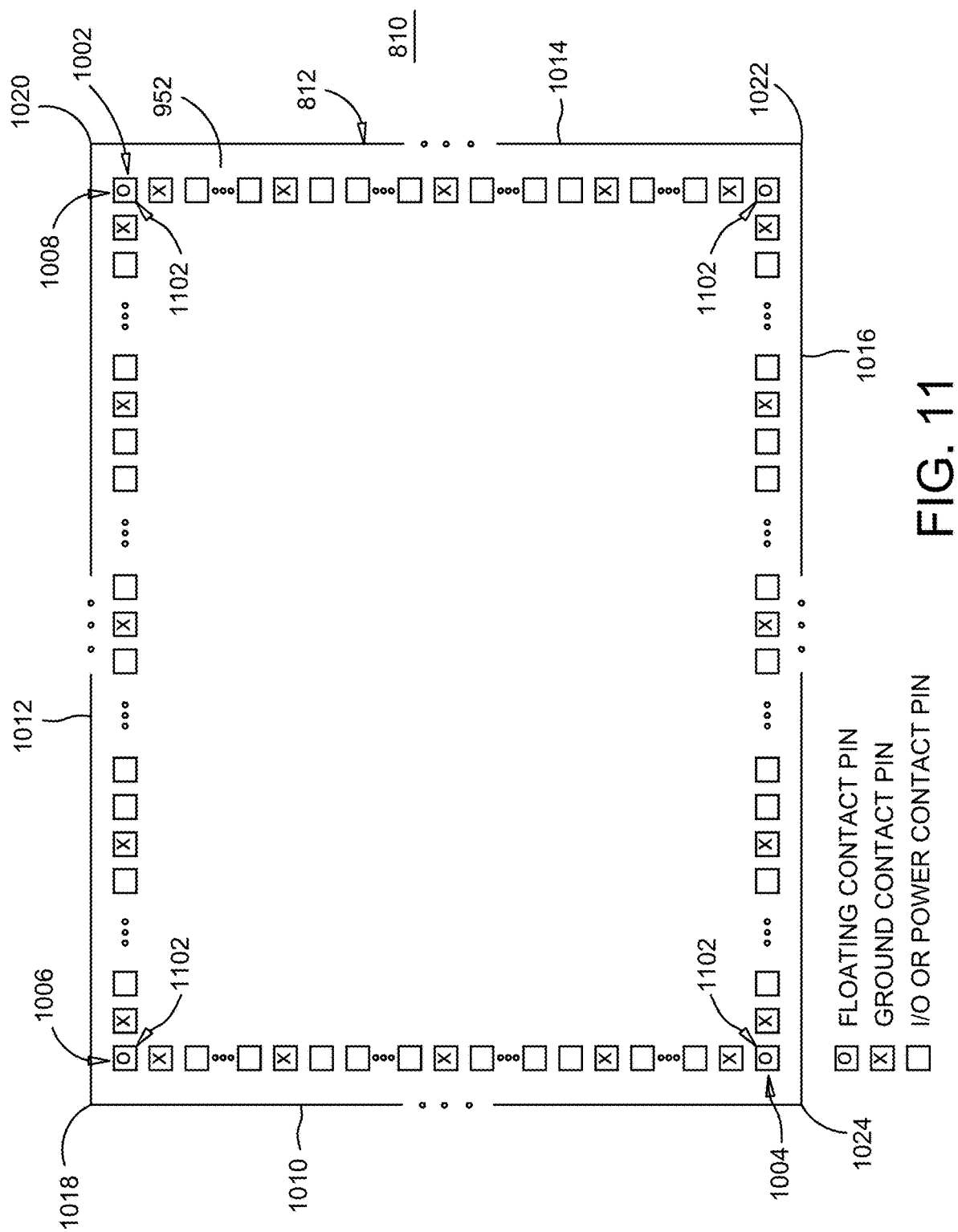

FIG. 11 is another exemplary top view of the surface 952 of the socket 810 having a different configuration of desirable locations of the first contact pins 930 relative the second contact pins 910. The locations of the first contact pins 930 essentially the same as illustrated in FIG. 11, except that the last contact pin 820 in each row 1002, 1004 and column 1006, 1008 is not coupled to ground, power or configured to transmit an I/O signal. Rather, the last contact pin 820 in each row 1002, 1004 and column 1006, 1008, shown in FIG. 11 as a box containing a circle, is floating. The floating contact pin 820 shown in FIG. 11 by the box containing a circle is referred herein after as the floating contact pin 1102.

Since the last contact pin 820 closest to the corners 1018, 1020, 1022, 1024 is floating, the first contact pin 930 closest the corners 1018, 1020, 1022, 1024 in each of the rows 1002, 1004 and columns 1006, 1008 is one of the next four contact pins 820 closest to the closest corner. In the example illustrated in FIG. 11, the contact pin 820 of each rows 1002, 1004 and columns 1006, 1008 is disposed directly adjacent the floating interconnect pin 1102.

Similar to the example described above with reference to FIG. 10, optional midway contact pins 1026 and optional middle contact pins 1028 may also be present in the rows 1002, 1004 and columns 1006, 1008 closest the edges 1010, 1012, 1014, 1016 of the recess 812 of the socket 810.

Figure 12:
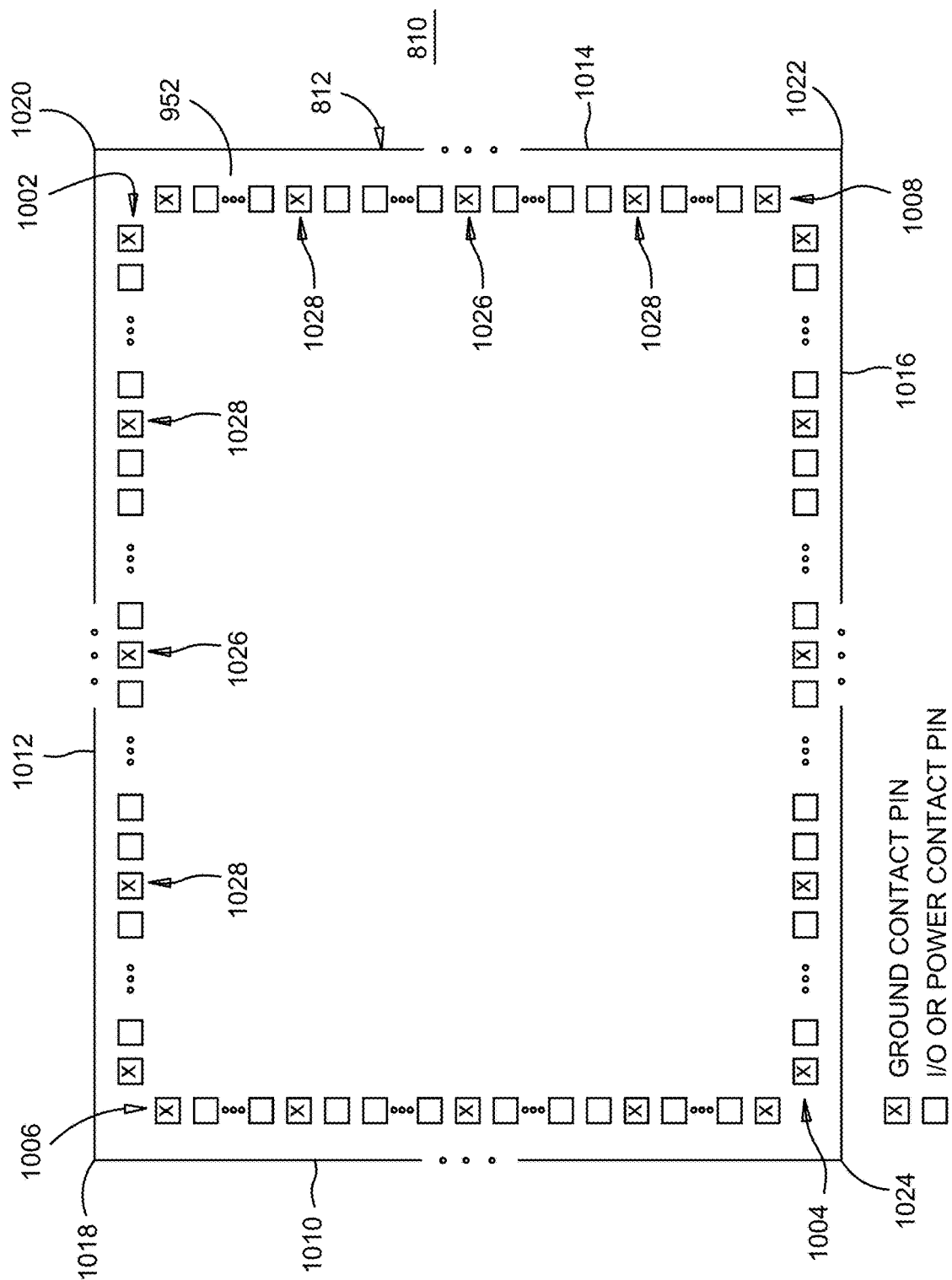

FIG. 12 is another exemplary bottom view of the chip package 100 having a different configuration of desirable locations of the first contact pins 930 relative the second contact pins 910. The locations of the first contact pins 930 are essentially the same as illustrated in FIG. 10, except that the last contact pins 820 of each row 1002, 1004 is not shared with the adjacent column 1006, 1008, and the last contact pins 820 of each column 1006, 1008 is not shared with the adjacent row 1002, 1004. Thus, each of the last contact pin 820 of each row 1002, 1004 and column 1006, 1008 closest to the corners 1018, 1020, 1022, 1024 that are configured as a first contact pin 930 that is uniquely present in only one of the rows 1002, 1004 and columns 1006, 1008. The first contact pin 930 closest to the corners 1018, 1020, 1022, 1024 is one of the last five contact pins 820 closest to the closest corner 1018, 1020, 1022, 1024. In the example depicted in FIG. 12, the first contact pin 930 closest to the corners 1018, 1020, 1022, 1024 is the contact pin 820 physically closest to the closest corner 1018, 1020, 1022, 1024.

Similar to the example described above with reference to FIG. 10, optional midway contact pins 1026 and optional middle contact pins 1028 may also be present in the rows 1002, 1004 and columns 1006, 1008 closest the edges 1010, 1012, 1014, 1016 of the recess 812 of the socket 810.

Returning to FIG. 8 as discussed above, the contact pins 820 of the test station 824 are coupled to the test controller 816. The test controller 816 generally executes test routine (e.g., predetermined test routine) that is stored in or accessible by the test controller 816. The test routine may be inputted into the test controller 816 through a user interface, or uploaded or accessed from the test controller 816 and/or host processing system (not shown). The test controller 816 executes the test routine in a manner that runs a predefined test on the chip package 100 disposed in the socket 810 of the test station 824. The test routine may be one or more of a DC test routine, a burn-in routine, post burn-in routine, a final test routine or other predefined test routine to be performed on the chip package 100.

In one example, a DC test routine is performed on a chip package 100 disposed in the socket 810 of the test station 824. The DC test routine may include subjecting the chip package 100 to a high DC load for a period to time, and testing the chip package 100 for electrical shorting, resistance, temperature rise, RC delay, speed, other performance characteristic or malfunction or other defect.

In another example, a burn-in test routine is performed on a chip package 100 disposed in the socket 810 of the test station 824. The burn-in test routine may include subjecting the chip package 100 to a high-stress environment, such as high voltage, high amperage, high temperature and/or high frequency electric signals. The burn-in test routine may include subjecting the chip package 100 to a high-stress environment for a period to time, and testing the chip package 100 for a short, resistance, temperature rise, RC delay, speed, other performance characteristic or malfunction or other defect.

In yet another example, a post burn-in test routine is performed on a chip package 100 disposed in the test station 824. The post burn-in test routine may include testing the electrical characteristics and function of the chip package 100 at room temperature and below room temperature. The post burn-in test routine may include subjecting the chip package 100 to a room temperature environment for a period to time, and testing the electrical characteristics and function of the chip package 100. The post burn-in test routine may also include subjecting the chip package 100 to a sub-room temperature environment for a period to time, and testing the electrical characteristics and function of the chip package 100. The post burn-in test routine may include determining test information, such as performance, functionality, pass, fail or other performance information associated with the tested chip package 100. Other performance may include, but is not limited to, one or more of resistance, temperature rise, RC delay, speed, malfunction or other defect In still yet another example, a final test routine is performed on a chip package 100 disposed in the test station 824. The final test routine may include testing the electrical characteristics and function of the chip package 100 at a temperature elevated above room temperature (e.g., elevated temperature such as at about 155 degrees Celsius) and/or at a temperature below room temperature (e.g., cold temperature such as at about −55 degrees Celsius). The final test routine may include subjecting the chip package 100 to an elevated (and/or cold) temperature environment for a period to time, and testing the electrical characteristics and function of the chip package 100. The final test routine may include determining test information, such as performance, functionality, pass, fail or other performance information, to the information stored on the test controller 816 and uniquely associated with the tested chip package 100.

In yet another example, the final test routine performed on a chip package 100 may mimic operating conditions of the device in which the chip package 100 will be interfaced with. The operating conditions of the final test routine may include temperature variation and voltage fluctuations. It is contemplated that other test routines may be performed in the test station 824 or other test station within the ATE 800.

Since chip packages 100 having different designs often have different patterns for interconnects 120 formed on the bottom surface of the package substrate 104 that do not match the pattern of contact pins 820 disposed in the bottom of the socket 810, the daughter board 826 may be easily replaced with another daughter board 826 having a replacement socket 810 that is configured to mate with the next chip package 100 to be tested in the ATE 800.

During any the of the tests described above or other test performed in the ATE 800, the first contact pin 930 that extends farther from the socket 810 than the second contact pin 910 beneficially grounds the chip package 100 being tested in the ATE 800 preferentially prior to contact with I/O interconnects 124 of chip package 100. Thus, if a ESD event occurs while connecting the chip package 100 to the test controller 816 through the socket 810, the ESD event is preferentially directed to ground relative to the I/O portions of the die circuitry 116 residing in the die 102 of the chip package 100.

Figure 13:
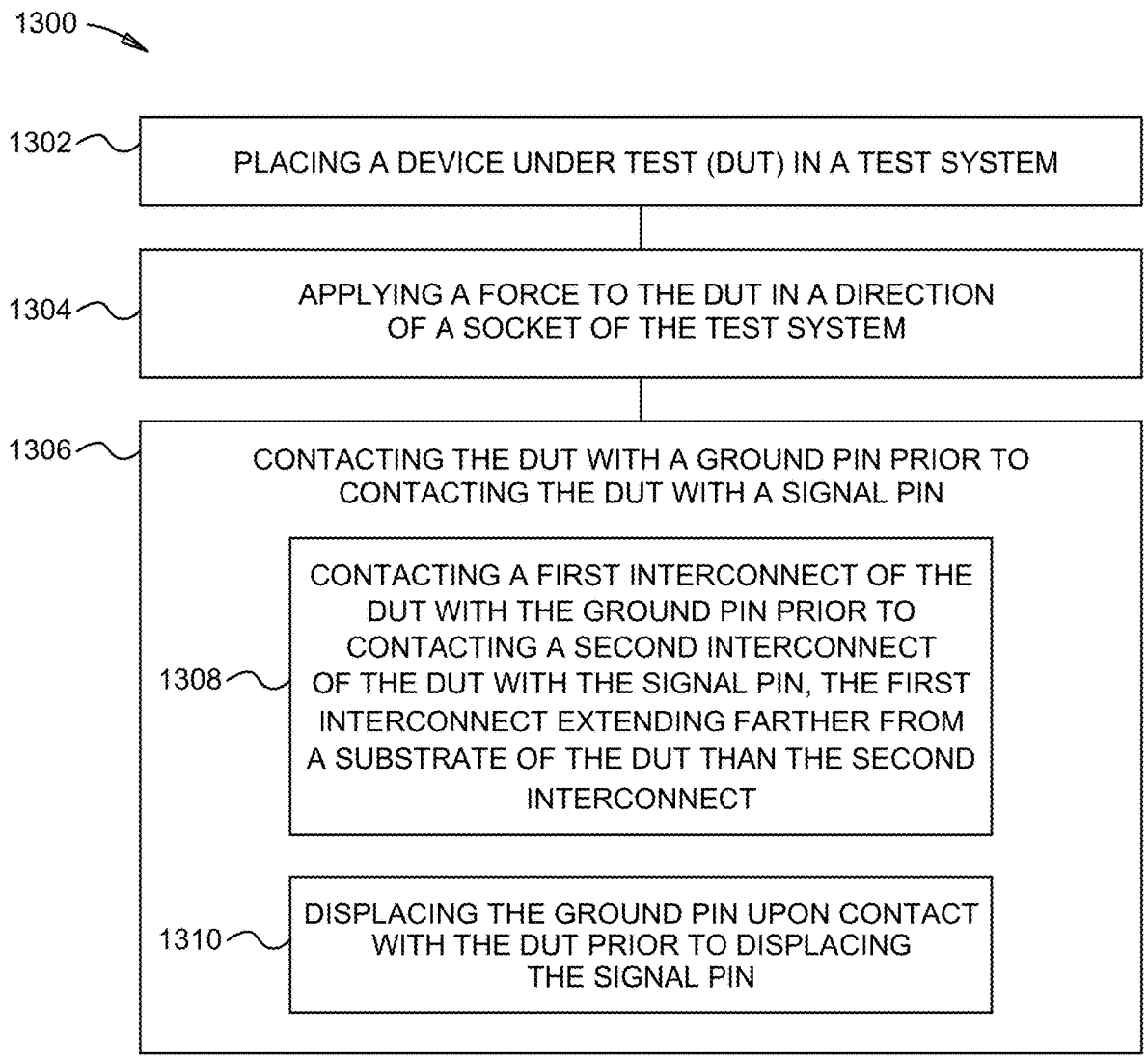
FIG. 13 is a flow diagram depicting a method of testing a chip package, according to an example.

FIG. 13 is a flow diagram depicting a method 1300 of testing an IC package, according to an example. The method 1300 begins at operation 1302 by placing a device under test (DUT), such as a chip package 100 or other chip package, in a test system, such as the automatic test equipment (ATE) 800 described above. At operation 1304, a force is applied to the DUT in a direction of a socket of the test system. The force is applied to the DUT by moving the pusher into contact with the DUT, and moving the DUT due to the displacement of the pusher towards the socket.

At operation 1306, the solder balls extending below the package substrate of the DUT contact the ground contact pin prior to O/I interconnects of the DUT contacting a signal contact pins of the ATE 800. The ground and signal contact pins extend from a surface of the socket facing the pusher. In one example, operation 1306 may be performed by sub-operation 1308. Sub-operation 1308 includes contacting a first interconnect 122 of the DUT with the ground contact pin prior to contacting a second interconnect 124 of the DUT with the signal contact pin, wherein the first interconnect 122 extends farther from the package substrate 104 of the DUT than the second interconnect 124.

Alternatively, operation 1306 may be performed by sub-operation 1310. Sub-operation 1310 includes displacing the ground contact pin upon contact with the DUT prior to displacing the signal contact pin through contact with I/O interconnects of the DUT. The ground contact pin may be displaced by the DUT prior to displacing the signal contact pin due to the ground contact pin extending further from the surface 952 of the socket 810 than the signal contact pin.

In either of sub-operations 1308, 1310, operation 1306 preferentially grounds the DUT prior to contact of the ATE 800 with the I/O interconnection 124 of the chip package 100. Thus, ESD events are preferentially routed away from the I/O interconnection 124 of the chip package 100, which advantageously contributes to less damage to charge-sensitive circuitry 406 of the chip package 100.

Thus, techniques for electrostatic discharge (ESD) protection in an IC chip package have been described above that advantageously directs the risk of ESD events through ground and power interconnects preferentially over I/O interconnects to enhance ESD protection. Since ESD protection circuitry formed within an IC die of the chip package that is connected the ground and power interconnects is more robust than circuitry connected to I/O interconnects, ESD protection is significantly enhanced, making for a more robust IC chip package. In other examples, ATEs and method of testing have been disclosed that enhance ESD protection of chip packages by directing the risk of ESD events preferentially to ground contacts pins over I/O interconnects to mitigate potential damage to the device under test (DUT), such as the chip package, from ESD events. Since the first contact between the DUT and ATE is made between a ground contact of the DUT, ESD between the DUT and ATE advantageously routed through the ground, which significantly reduces the risk of ESD damage to the DUT, beneficially improving production IC package yields and providing associated cost advantages.

The disclosure above may be expressed in different ways. Some non-limiting examples can be expressed as follows.

In a first example of an integrated circuit (IC) chip package includes: an IC die having a die body and die circuitry formed within the die body; a substrate having a first side, a second side and substrate circuitry, the die body mounted to the first side of the substrate such that the substrate circuitry is electrically coupled to the die circuitry, and a plurality of interconnects exposed on the second side of the substrate, the plurality of interconnects providing terminations for the substrate circuitry formed within the substrate, the plurality of interconnects includes: a first row of interconnects disposed along a first edge of the first side; a second row of interconnects disposed along a second edge of the first side; a first column of interconnects disposed along a third edge of the first side; and a second column of interconnects disposed along a fourth edge of the first side, wherein the first and second rows and the first and second columns meeting at four corners of the first side, wherein at least one of last 5 interconnects of the plurality of interconnects closest to the corner of each of the first and second rows and columns has a first height that is greater than a second height of another interconnect comprising the same row or column of interconnects.

In a second example, based on the IC chip package of the first example, an interconnect closest to the corner of each of the first and second rows and columns has the first height that is greater than the second height of another interconnect comprising the same row or column of interconnects.

In a third example, based on the IC chip package of the first example, a midway interconnect of the interconnects comprising the first row of interconnects is disposed approximately midway between the corners disposed at first and second ends of first row has the first height that is greater than the second height of another interconnect comprising the same row or column of interconnects.

In a fourth example, based on the IC chip package of the third example, a first middle interconnect of the interconnects comprising the first row of interconnects is disposed approximately half way between the midway interconnect and a first interconnect of the first row, and wherein a second middle interconnect of the interconnects comprising the first row of interconnects is disposed approximately half way between the midway interconnect and a last interconnect of the first row, wherein the first and second middle interconnects have the first height that is greater than the second height of another interconnect comprising the same row or column of interconnects.

In a fifth example, based on the IC chip package of the fourth example, each of the interconnects having the first height has a first solder ball that extends further from the first side of the substrate than second solder ball of one of the interconnects having the second height.

In a sixth example, based on the IC chip package of the fifth example, the first solder ball has a dimension in a direction normal to the first side that is greater than a dimension in a direction normal to the first side of the second solder ball.

In a seventh example, based on the IC chip package of the fifth example, an edge of the first solder ball closest to the first side is further from the first side than an edge of the second solder ball closest to the first side.

In an eighth example, based on the IC chip package of the fourth example, the circuitry formed within the die body comprises: inputs configured to receive an input voltage, the inputs coupled to the interconnects having the first height; and outputs configured to couple to ground, the outputs coupled to the interconnects have the first height.

In a ninth example, based on the IC chip package of the fourth example, all the interconnects having the first height are coupled to nodes of the circuitry configured couple to power or ground.

In a tenth example, based on the IC chip package of the fourth example, the second row comprises: a midway interconnect of the interconnects comprising the second row of interconnects is disposed approximately midway between the corners disposed at first and second ends of second row, the midway interconnect extending to the first height from the first side; a first middle interconnect of the interconnects comprising the second row of interconnects is disposed approximately half way between the midway interconnect of the second row and a first interconnect of the second row; and a second middle interconnect of the interconnects comprising the second row of interconnects is disposed approximately half way between the midway interconnect of the second row and a last interconnect of the second row, wherein the first and second middle extend to the first height from the first side.

In an eleventh example, based on the IC chip package of the tenth example, the first column comprises: a midway interconnect of the interconnects comprising the first column of interconnects is disposed approximately midway between the corners disposed at first and second ends of first column, the midway interconnect extending to the first height from the first side; a first middle interconnect of the interconnects comprising the first column of interconnects is disposed approximately half way between the midway interconnect of the first column and a first interconnect of the first column; and a second middle interconnect of the interconnects comprising the first column of interconnects is disposed approximately half way between the midway interconnect of the first column and a last interconnect of the first column, wherein the first and second middle extend to the first height from the first side; and wherein the second column comprises: a midway interconnect of the interconnects comprising the second column of interconnects is disposed approximately midway between the corners disposed at first and second ends of second column, the midway interconnect extending to the first height from the first side; a first middle interconnect of the interconnects comprising the second column of interconnects is disposed approximately half way between the midway interconnect of the second column and a first interconnect of the second column; and a second middle interconnect of the interconnects comprising the second column of interconnects is disposed approximately half way between the midway interconnect of the second column and a last interconnect of the second column, wherein the first and second middle extend to the first height from the first side.

In a twelfth example, based on the IC chip package of the first example, each of the interconnects having the first height has a first solder ball that extends further from the first side of the substrate than second solder ball of one of the interconnects having the second height.

In a thirteenth example, based on the IC chip package of the twelfth example, the first solder ball has a dimension in a direction normal to the first side that is greater than a dimension in a direction normal to the first side of the second solder ball.

In a fourteenth example, based on the IC chip package of the twelfth example, an edge of the first solder ball closest to the first side is further from the first side than an edge of the second solder ball closest to the first side.

In an fifteenth example, based on the IC chip package of the first example, the circuitry formed within the die body comprises: inputs configured to receive an input voltage, the inputs coupled to the interconnects having the first height; and outputs configured to couple to ground, the outputs coupled to the interconnects have the first height.

In a sixteenth example, based on the IC chip package of the first example, all the interconnects having the first height are coupled to nodes of the circuitry configured couple to power or ground.

In a seventeenth example, based on the IC chip package of the first example, the interconnects in the first and second rows and the first and second columns extend the first height from the first side.

In an eighteenth example, an integrated circuit (IC) chip package includes: an IC die having a die body and die circuitry formed within the die body; a substrate having a first side, a second side and substrate circuitry, the die body mounted to the first side of the substrate such that the substrate circuitry is electrically coupled to the die circuitry by a plurality of first interconnects, the plurality of first interconnects configured as ground, power and I/O interconnects, and a plurality of second interconnects exposed on the second side of the substrate, the plurality of second interconnects providing terminations for the substrate circuitry formed within the substrate, the plurality of second interconnects comprising: a first row of second interconnects disposed along a first edge of the first side, the first row of second interconnects including two second interconnects disposed at opposite ends of the first row and coupled to ground interconnects, the two second interconnects having a first height that is greater than a second height of second interconnects coupled to I/O interconnects.

In a nineteenth example, based on the IC chip package of the eighteenth example, the first row of second interconnects further comprises: a midway interconnect disposed between the two interconnects having the first height, the midway extending the first height from the first side.

In a twentieth example, based on the IC chip package of the nineteenth example, the first row of second interconnects further comprises: a first middle interconnect disposed between the midway interconnect and one of the two interconnects having the first height; and a second middle interconnect disposed between the midway interconnect and the other of the two interconnects having the first height, the first and second middle interconnects extending the first height from the first side.

While the foregoing is directed to specific examples, other and further examples may be devised without departing from the basic scope thereof, and the scope thereof is determined by the claims that follow.

What is claimed is:

1. A test system comprising:
   a base; and
   a socket disposed on the base, the socket having a first surface configured to engage a device under test (DUT), the socket comprising:
   a first displaceable contact pin projecting a first distance beyond the first surface of the socket, the first displaceable contact pin coupled to ground; and
   a second displaceable contact pin projecting a second distance beyond the first surface of the socket that is less than the first distance, the second displaceable contact pin configured to provide an I/O signal to the DUT.

2. The test system of claim 1, wherein the first and second displaceable contact pins are included in a plurality of contact pins projecting from the socket, the plurality of contact pins comprising:
   a first row of contact pins disposed along a first edge of the first surface;
   a second row of contact pins disposed along a second edge of the first surface;
   a first column of contact pins disposed along a third edge of the first surface; and
   a second column of contact pins disposed along a fourth edge of the first surface, wherein the first and second rows and the first and second columns meeting at four corners of the first surface, wherein at least one of last 5 contact pins of the plurality of contact pins closest to one of the corners of each of the first and second rows and columns extends the first distance beyond the first surface of the socket, wherein one of the at least one of last 5 contact pins extending the first distance is the first displaceable contact pin.

3. The test system of claim 2, wherein the first displaceable contact pin is closest to one of the corners.

4. The test system of claim 2, wherein the displaceable contact pin of the last 5 contact pins that extends the first distance in each of the first and second rows and columns are the contact pin closest to the nearest corner.

5. The test system of claim 2, wherein a midway contact pin of the contact pins comprising the first row of contact pin is disposed approximately midway between the corners disposed at first and second ends of first row has the first distance that is greater than the second distance of another contact pin comprising the same row or column of contact pins.

6. The test system of claim 5, wherein a first middle contact pin of the contact pins comprising the first row of contact pins is disposed approximately half way between the midway contact pin and a first contact pin of the first row, and wherein a second middle contact pin of the contact pins comprising the first row of contact pins is disposed approximately half way between the midway contact pin and a last contact pin of the first row, wherein the first and second middle contact pins extend the first distance beyond the first surface of the socket.

7. The test system of claim 1 further comprising:
   a plurality of contact pins, including the first displaceable contact pin, extending the first distance beyond the first surface of the socket, the plurality of contact pins coupled to ground.

8. The test system of claim 7, wherein the plurality of contact pins extending the first distance beyond the first surface of the socket are disposed in rows or columns of contact pins that are closest to an edge of the of the socket.

9. The test system of claim 8, wherein in each row and column disposed closest to the edges of the socket, the contact pins extending the first distance beyond the first surface of the socket are disposed closest at opposite ends and about midway of the row or column.

10. A method for testing a substrate, comprising:
    placing a device under test (DUT) in an a test system; and
    contacting the DUT with a displaceable ground pin prior to contacting the DUT with a displaceable signal pin, wherein the ground pin projects a first distance beyond a surface of a socket configured to receive the DUT, and the signal pin projects a second distance beyond the surface that is less than the first distance.

11. An integrated circuit (IC) chip package comprising:
    an IC die having a die body and die circuitry formed within the die body;
    a substrate having a first side, a second side and substrate circuitry, the die body mounted to the first side of the substrate such that the substrate circuitry is electrically coupled to the die circuitry, and
    a plurality of interconnects exposed on the second side of the substrate, the plurality of interconnects providing terminations for the substrate circuitry formed within the substrate, the plurality of interconnects comprising:
    a first row of interconnects disposed along a first edge of the first side;

a second row of interconnects disposed along a second edge of the first side;

a first column of interconnects disposed along a third edge of the first side; and a second column of interconnects disposed along a fourth edge of the first side, wherein the first and second rows and the first and second columns meeting at four corners of the first side, wherein at least one of last 5 interconnects of the plurality of interconnects closest to the corner of each of the first and second rows and columns has a first height that is greater than a second height of another interconnect comprising the same row or column of interconnects.

12. The IC chip package of claim 11, wherein an interconnect closest to the corner of each of the first and second rows and columns has the first height that is greater than the second height of another interconnect comprising the same row or column of interconnects.

13. The IC chip package of claim 11, wherein a midway interconnect of the interconnects comprising the first row of interconnects is disposed approximately midway between the corners disposed at first and second ends of first row has the first height that is greater than the second height of another interconnect comprising the same row or column of interconnects.

14. The IC chip package of claim 13, wherein a first middle interconnect of the interconnects comprising the first row of interconnects is disposed approximately half way between the midway interconnect and a first interconnect of the first row, and wherein a second middle interconnect of the interconnects comprising the first row of interconnects is disposed approximately half way between the midway interconnect and a last interconnect of the first row, wherein the first and second middle interconnects have the first height that is greater than the second height of another interconnect comprising the same row or column of interconnects.

15. The IC chip package of claim 14, wherein the circuitry formed within the die body comprises:

inputs configured to receive an input voltage, the inputs coupled to the interconnects having the first height; and outputs configured to couple to ground, the outputs coupled to the interconnects have the first height.

16. The IC chip package of claim 14, wherein all the interconnects having the first height are coupled to nodes of a circuitry configured couple to power or ground.

17. The IC chip package of claim 14, wherein the second row comprises:

a midway interconnect of the interconnects comprising the second row of interconnects is disposed approximately midway between the corners disposed at first and second ends of second row, the midway interconnect extending to the first height from the first side;

a first middle interconnect of the interconnects comprising the second row of interconnects is disposed approximately half way between the midway interconnect of the second row and a first interconnect of the second row; and a second middle interconnect of the interconnects comprising the second row of interconnects is disposed approximately half way between the midway interconnect of the second row and a last interconnect of the second row, wherein the first and second middle extend to the first height from the first side.

18. The IC chip package of claim 14, wherein each of the interconnects having the first height has a first solder ball that extends further from the first side of the substrate than second solder ball of one of the interconnects having the second height.

19. The IC chip package of claim 18, wherein the first solder ball has a dimension in a direction normal to the first side that is greater than a dimension in a direction normal to the first side of the second solder ball.

20. The IC chip package of claim 18, wherein an edge of the first solder ball closest to the first side is further from the first side than an edge of the second solder ball closest to the first side.

* * * * *

UNITED STATES PATENT AND TRADEMARK OFFICE
CERTIFICATE OF CORRECTION

PATENT NO. : 11,043,484 B1
APPLICATION NO. : 16/362134
DATED : June 22, 2021
INVENTOR(S) : Hong Shi Page 1 of 1

It is certified that error appears in the above-identified patent and that said Letters Patent is hereby corrected as shown below:

In the Claims

Column 20, Line 41, In Claim 8, delete "of the of the" and insert -- of the --, therefor.

Column 20, Line 48, In Claim 10, delete "an a" and insert -- a --, therefor.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*